United States Patent
Todorov et al.

(10) Patent No.: US 6,297,611 B1
(45) Date of Patent: Oct. 2, 2001

(54) ROBOT HAVING INDEPENDENT END EFFECTOR LINKAGE MOTION

(75) Inventors: Alexander Todorov; Zlatko Sotirov, both of Sunnyvale; Mila Genov, San Jose, all of CA (US)

(73) Assignee: Genmark Automation, Sunnyvale, CA (US)

(*) Notice: Subject to any disclaimer, the term of this patent is extended or adjusted under 35 U.S.C. 154(b) by 0 days.

(21) Appl. No.: 09/610,969

(22) Filed: Jul. 6, 2000

(51) Int. Cl.⁷ .................................................. B25J 15/02
(52) U.S. Cl. .................. 318/568.21; 318/568.19; 318/567; 318/571; 901/8; 901/15
(58) Field of Search .................. 318/568.21, 568.19, 318/567, 571; 901/8, 15

(56) References Cited

U.S. PATENT DOCUMENTS

| | | | |
|---|---|---|---|
| 6,105,454 | * | 8/2000 | Bacchi et al. ............... 901/40 |
| 6,155,768 | * | 12/2000 | Bacchi et al. ............... 901/8 |
| 6,197,017 | * | 3/2001 | Brock et al. ............. 318/658.19 |

* cited by examiner

Primary Examiner—Karen Masih
(74) Attorney, Agent, or Firm—Burns Doane Swecker & Mathis

(57) ABSTRACT

A substrate handling system comprises a robot containing mico-environment in communication with a plurality of processing stations. The robot has a robot arm comprising an end effector linkage mounted to an extensible linkage. Each of the linkages is independently actuatable using an associated motor, with the extensible linkage serving to convey the end effector linkage to the vicinity of a target processing station for delivery or retrieval of a substrate. Motion of the linkages may be synchronized to reduce travel time, and multiple end effectors may be mounted to the extensible linkage for increasing throughput.

24 Claims, 5 Drawing Sheets

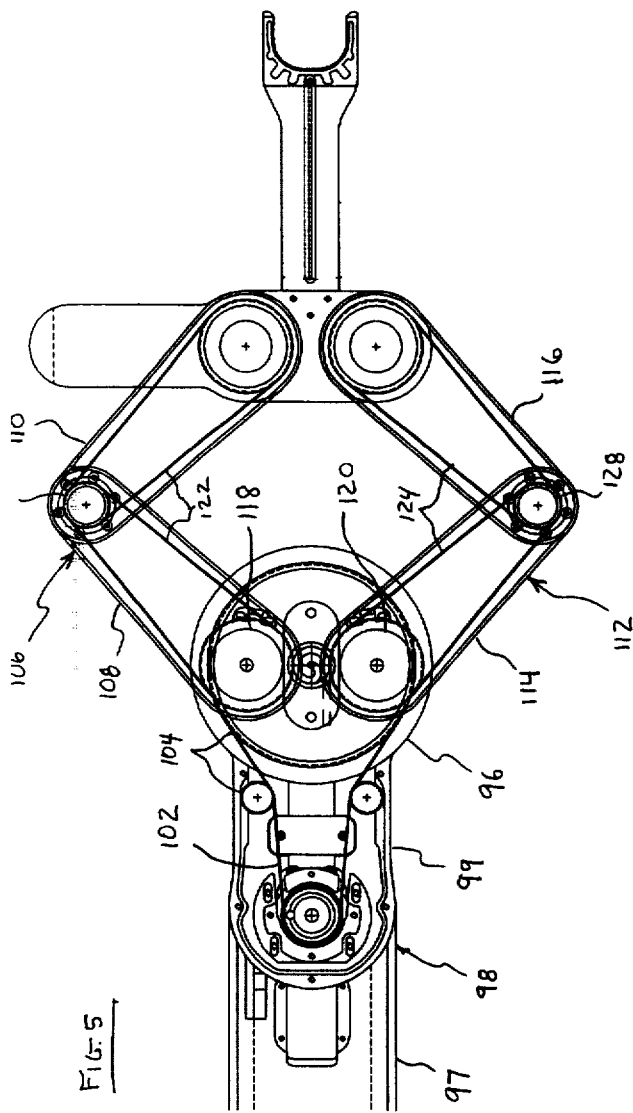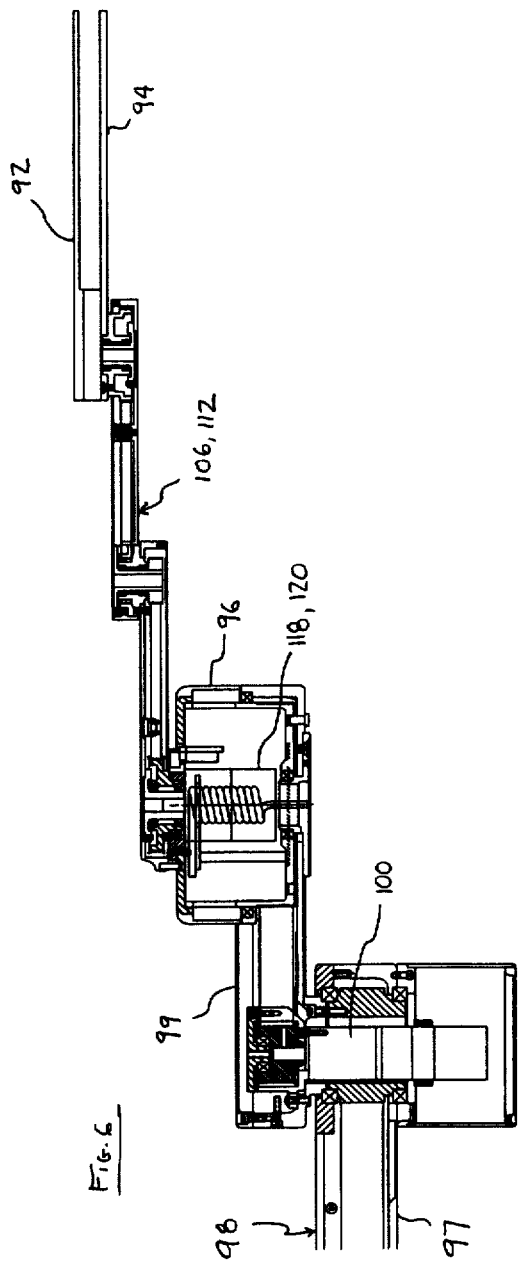

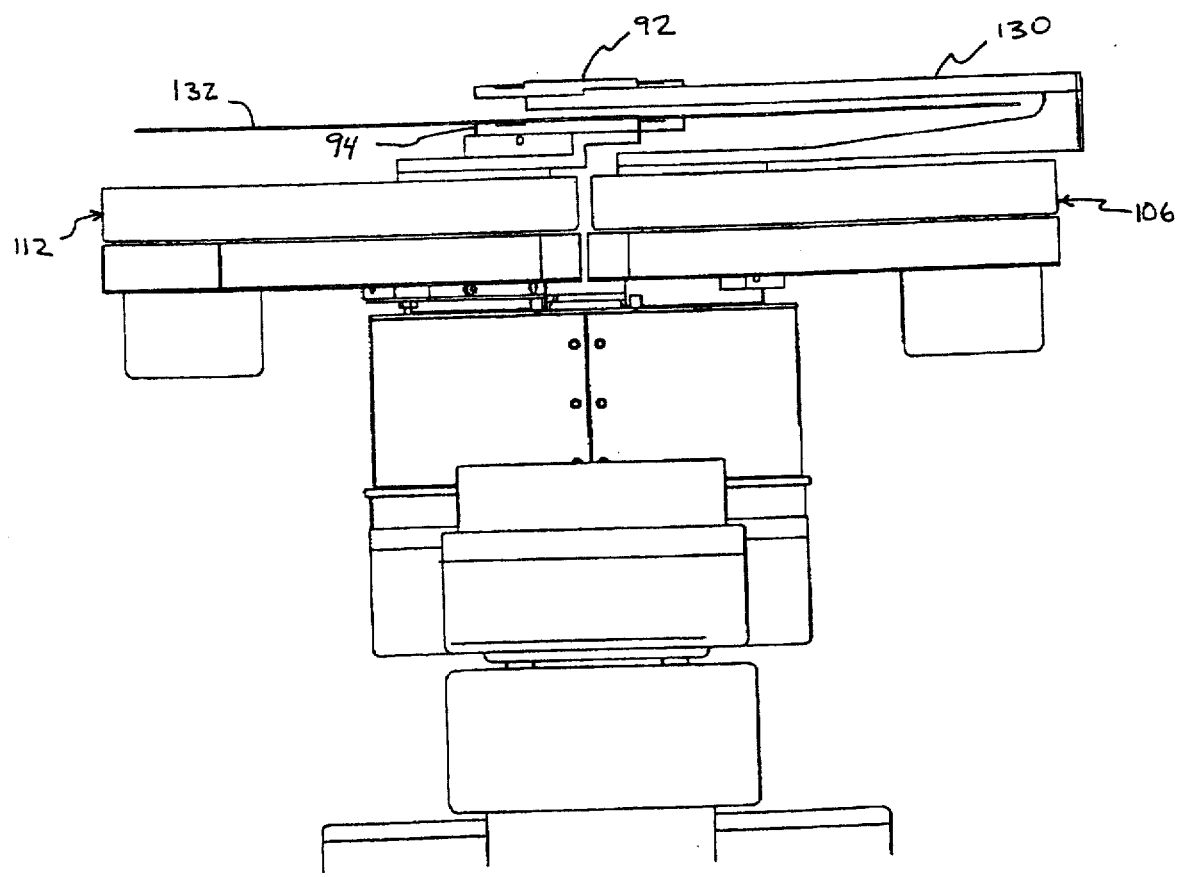

US 6,297,611 B1

ROBOT HAVING INDEPENDENT END EFFECTOR LINKAGE MOTION

CROSS-REFERENCE TO RELATED APPLICATIONS (Not applicable)

BACKGROUND OF THE INVENTION

1. Field of the Invention

The invention relates to substrate handling systems, and more particularly, to systems using robots to transport substrates between different locations.

2. Description of Related Art

During integrated chip manufacture and other industrial applications, substrates such as semiconductor wafers undergo numerous processing steps. Typically, these steps take place in dedicated processing stations remotely situated from each other and from the storage containers or cassettes used to hold the substrates. In integrated chip manufacture, the semiconductor wafers from which the chips are fabricated need to be contained in a carefully controlled environment in which temperature, humidity, and contaminant level, among other factors, need to be carefully controlled. Robots are often deployed to transport the wafers between processing stations, or to retrieve and return the wafers to the storage cassettes before and after processing.

One prior art arrangement for handling semiconductor substrates is shown in FIG. 1, wherein a robot arm 10 is used to transport the substrates (not shown) between a bank of processing stations 12. Robot arm 10 has three arm links 14, 16 and 18 mounted in a base 19. Proximalmost link 14 is rotatably mounted at its proximal end to base 20, and links 16 and 18 are similarly mounted such that each succeeding link is rotatably mounted to the distalmost end of the preceding link. Rotation of links 14, 16 and 18 is mechanically coupled, using suitable linkages such as belts and pulleys (not shown), such that the distal end of distalmost link 18 can be extended or retracted relative to base 20. A first motor (not shown) motivates this motion. The distal end of distalmost link 18 supports an end effector 22 which may be mounted for independent motion, using a second motor (not shown), such that yaw motion of the end effector can be achieved.

To laterally extend the reach of robot arm 10, base 20 is mounted for translation in the x direction, on a track 24. In this manner, robot arm 10, and end effector 22 in particular, can be moved along the x direction to reach an increased number of processing stations 12. A third motor (not shown) is used to effect this translation.

The above prior art arrangement suffers from several disadvantages. First, valuable space is wasted by track 24 and the supporting components required to translate robot arm 10 in the x direction, space generally delineated by the dashed line 26 in FIG. 1. Second, motion along track 24 generates friction, which in turn generates particles which contaminate the "clean room" environment required for semiconductor processing.

BRIEF SUMMARY OF THE INVENTION

The invention addresses the aforementioned and other disadvantages of the prior art by providing a robot arm in which an end effector linkage is mounted on an extensible linkage. Extension or retraction of the extensible linkage causes translation of the end effector linkage in the X direction, thereby increasing the range of the robot arm in the X direction. The motions of the extensible linkage and the end effector linkage are decoupled, and motion of one linkage is independent of motion of the other linkage.

The extensible linkage can be used to support more than one end effector linkage. Each end effector linkage can be mounted for motion which is independent from the other end effector linkage(s) and from the extensible linkage. In this manner, more than one processing station or storage location can be accessed by the robot arm.

In accordance with the invention, a robot arm as described above is mounted on a robot housed within a micro-environment enclosure in which semiconductor processing is effected. Process and/or storage stations are in communication with micro-environment enclosure, with the robot serving to transport substrates therebetween.

BRIEF DESCRIPTION OF THE SEVERAL VIEWS OF THE DRAWING(S)

Many advantages of the present invention will be apparent to those skilled in the art with a reading of this specification in conjunction with the attached drawings, wherein like reference numerals are applied to like elements and wherein:

FIG. 5 is a schematic top view of a robot in accordance with the preferred embodiment of the invention;

FIG. 6 is a schematic partial side elevational view of the robot of FIG. 5; and

FIG. 7 is a schematic front elevational view of the robot of FIG. 5 with a substrate.

DETAILED DESCRIPTION OF THE INVENTION

Figure 2:
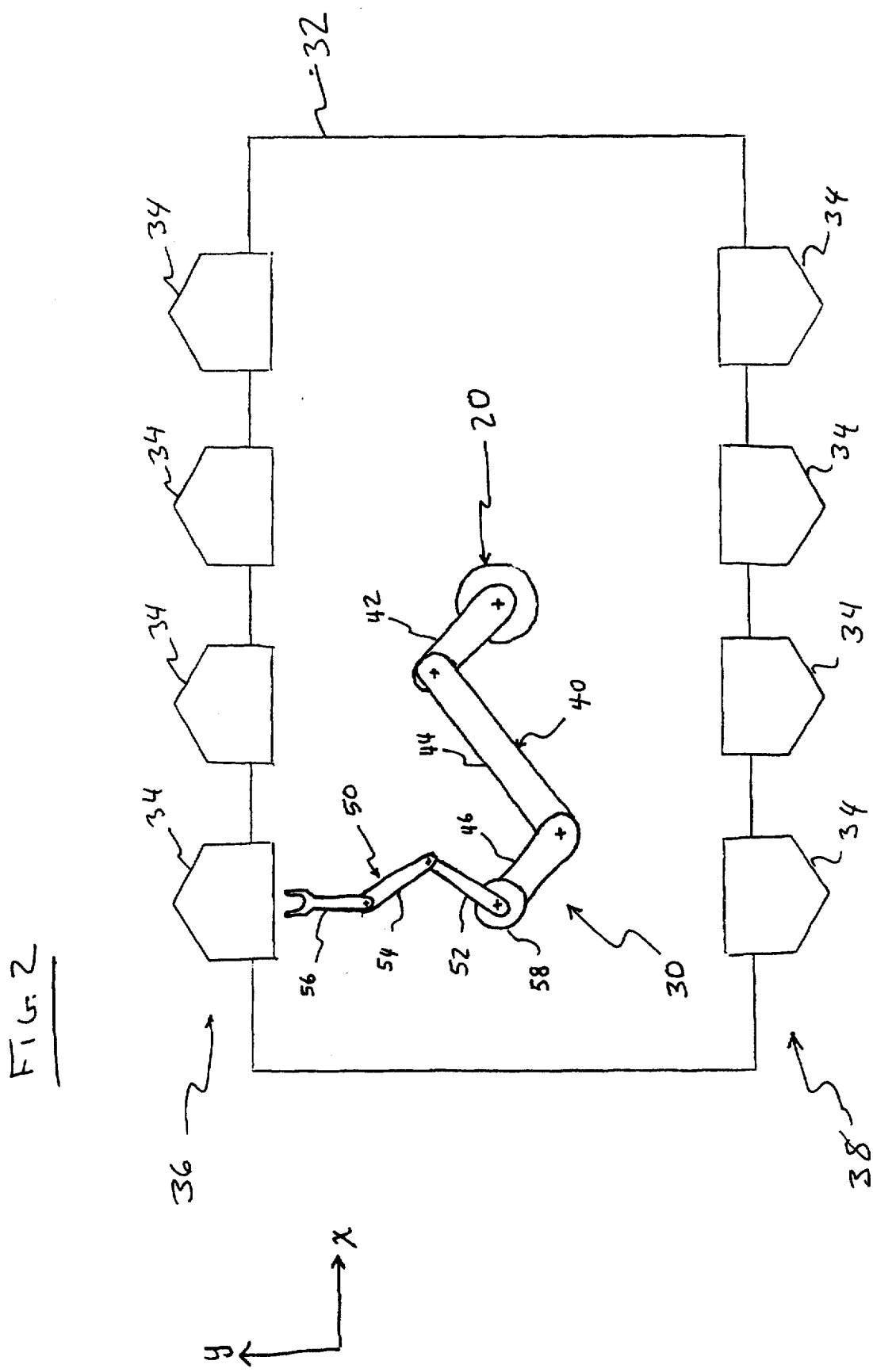
FIG. 2 is a schematic top plan view of a substrate handling system in accordance with the invention.

FIG. 2 shows a robot 20 having a robot arm 30 in accordance with the invention. Robot 20 and robot arm 30 are contained within a micro-environment enclosure 32 which is in communication with a plurality of stations 34 arranged along two rows 36 and 38. Each station 34 can be a processing station in which steps of a semiconductor manufacturing process are to be performed on a semiconductor wafer (not shown), or a storage module such as a cassette containing a stack of such wafers.

Robot arm 30 comprises an extensible linkage 40 and an end effector linkage 50. Extensible linkage 40 comprises individual links 42, 44 and 46, with link 42 being considered proximalmost and being rotatably mounted at a proximal portion thereof in robot 20. Similarly, link 44 is rotatably mounted at a proximal portion thereof to a distal portion of link 42, and link 46 is rotatably mounted at a proximal portion thereof to a distal portion of link 44. It will be understood that the terms "proximal," "proximalmost," "distal," and "distalmost," used herein are relative terms and are not to intended to be limited to any specific physical elements described, but are rather intended to merely designate relationships between elements.

End effector linkage 50 is mounted at the distal portion of distalmost link 46 of extensible linkage 40. An end effector support structure 58 is provided at the distal portion of link 46 for supporting the end effector linkage 50. End effector linkage 50 comprises proximalmost link 52 mounted at a proximal portion thereof to support structure 58. Link 52 is rotatable, either by virtue of rotation relative to structure 58 or by rotation of structure 58 itself. Rotation is imparted using a suitable motor discussed below. Link 54 is rotatably mounted at a proximal portion thereof to a distal portion of link 52. At the distal portion of link 54, an end effector 56 is rotatably mounted and suitably configured for holding substrates such as semiconductor wafers and conveying these to or from the different stations 34.

Motion of linkages 40 and 50 is preferably decoupled. In this manner, extensible linkage 40 serves to generally transport end effector linkage 50 laterally along the X direction by translating distalmost portion of link 46, to which end effector linkage 50 is mounted, along a lateral trajectory. End effector linkage 50 is thus transported to the vicinity of the desired station 34, thereby enabling end effector linkage 50 to reach the station 34 in order to deliver the wafer thereto or retrieve it therefrom. Such motion of end effector linkage 50, and of end effector 56 in particular, may be along a straight line trajectory or a different trajectory depending on the arrangement of stations and the particular application contemplated. Additionally, it will be appreciated that the motions of the linkages 40 and 50, while decoupled mechanically, may be synchronized in time so as to reduce the length of time required to reach a particular station 34. Specifically, extension or retraction of extensible linkage 40 may occur during a first duration, while extension or retraction of end effector linkage 50 may occur during a second duration. However, the first and second durations may at least partially overlap to reduce overall time of the combined motions. Of course, such synchronization would be governed by the particular layout of the system as a whole, taking in account the presence of obstacles at a particular instant during motion of the linkages 40 and 50 and the end effector 56.

Figure 3:
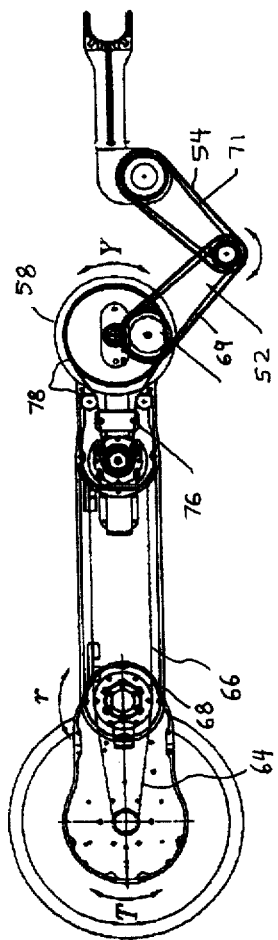
FIG. 3 is a schematic top view of a robot in accordance with the invention.
Figure 4:
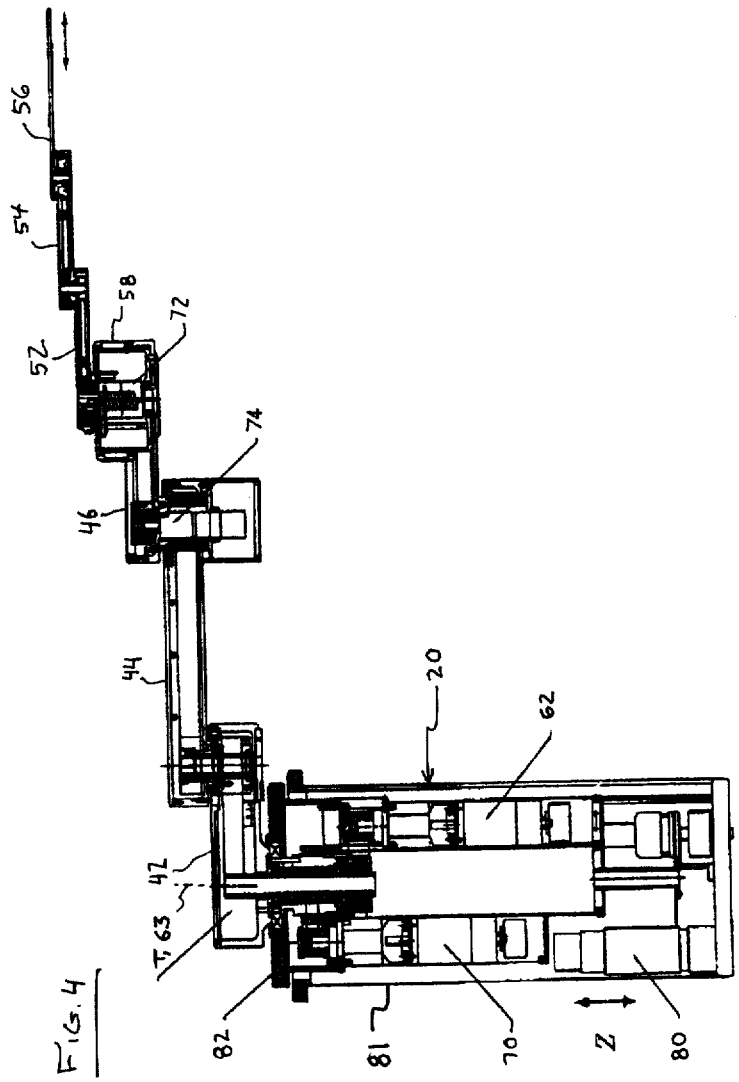
FIG. 4 is a schematic side elevational view of the robot of FIG. 3.

Motion to extensible linkage 40 is imparted using a first, R-axis motor 62 housed in robot 20 as shown in FIGS. 3 and 4. R-axis motion is the extension and retraction motion of linkage 40 along the X direction, with the origin of this radial motion being taken to be rotation axis 63 of the proximal portion of proximalmost link 42. Rotation of motor 62 is transferred to links 42, 44 and 46 via a first mechanical linkage which includes belts 64 and 66 cooperating with pulleys such as pulley 68, as seen from FIGS. 3 and 4. It will be appreciated that the number of links of the extensible linkage 40 and end effector linkage 50 can be different from that described. In the three-link arrangement, the mechanical linkages used to couple the links preferably provide a 1:2 motion ratio between the first and second link and then a 2:1 ratio between the second and third link so that the result is linear motion of the linkage as a whole. Accordingly, as mentioned above, rotation of motor 62 results in extension and retraction of linkage 40 in a straight line in the x direction, thereby translating end effector linkage 50 mounted thereon in the direction of rows 36 and 38 of stations 34. Other motions, of course, are possible, depending on the particular application and the arrangement of stations 34 to be accessed. For instance, robot arm 30 can also be rotated (T-axis motion), for example to accommodate a different arrangement of stations 34. T-axis motion can be provided by a motor 70 in robot 20. In FIG. 4, the T-axis is shown to be coincident with axis 63 about which link 42 rotates. It will be appreciated that this is not necessary, however, and a non-coincident configuration is also contemplated.

End effector linkage 50 can be extended and retracted independently of extensible linkage 40. Extension/retraction motion of end effector linkage 50 is motivated by motor 72 provided in support structure 58. A suitable belt and pulley linkage, including belts 69 and 71 for instance, transfers rotation of motor 72 to links 52 and 54 and end effector 56 in a manner similar to that described with respect to extensible linkage 40. The extension/retraction motion of end effector linkage 50 will be referred to as secondary radial motion as referenced from support structure 58. Motors 62 and 72 corresponding to extensible linkage 40 and end effector linkage 50, respectively, are independently actuated such that the motions of the two linkages are decoupled.

Figure 1:
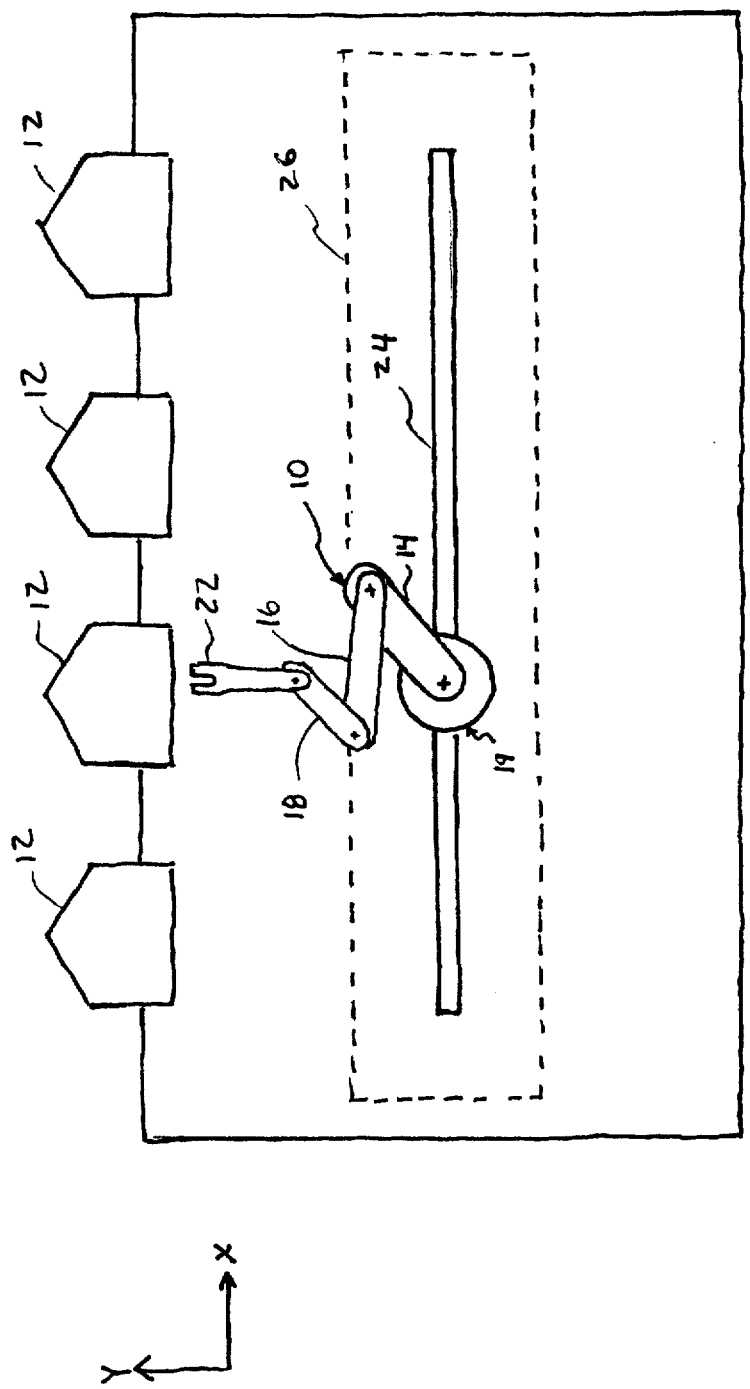
FIG. 1 is a schematic top view of a prior art substrate handling system.

The arrangement of FIG. 1 is such that two rows (36, 38) of stations 34 are arranged in opposing relation, with arm 30 disposed therebetween. To access confronting stations, end effector 56 is mounted in end effector linkage 50 such that its motion is "reversible" and it can be "flipped" to access stations 34 from either row 36 or row 38. Specifically, as seen from FIG. 3, links 52 and 54 and end effector 56 are stacked one on top of the other such that rotation of any of the links does not interfere with rotation of any other link. A similar arrangement is shown for the extensible linkage 40, providing a "reversible" extension direction such that stations on either side of the robot 20 along the X direction can be accessed. In other words, the extensible linkage 40 can be made to extend either to the right or to the left of robot 20 in the plane of FIG. 1.

End effector linkage 50 is also equipped for Y-axis, or yaw, motion. Such motion is provided by Y-axis motor 74 mounted to second link 44 of extensible linkage 40 and connected via belt 76 and pulleys 78 to support structure 58 in order to rotate the support structure and end effector linkage 50 mounted thereon. In this manner, Y-axis, or yaw, motion of end effector linkage 50 is achieved. This motion can be used to supplement or replace the secondary radial motion of end effector linkage 50 in order to achieve the reversible motion of the end effector 50 described above. Additionally, end effector 56 itself can be mounted to have yaw axis motion. A separate motor (not shown) can be provided for this purpose.

Robot 20 is preferably a GPR (Global Positioning Robot) type robot and is provided with elevational, Z-axis motion for arm 30. A plurality of Z-axis motors 80 (only one is shown) mounted in a stationary frame 81 are used to vertically move a plate 82, which is part of an elevatable frame in which arm 30 is mounted, in order to impart elevational motion to robot arm 30. Robot 20 is also designed to be tiltable with respect to the Z axis in order to provide an additional degree of freedom to arm 30 generally and to end effector 56 in particular. Tilting is achieved by for example rotating motors 80 to different extents as described in detail in related U.S. Pat. Ser. Nos. 5,954,840 and 6,059,516 which are directed to a GPR robot and which are incorporated herein by reference. A GPR robot is a parallel-serial type manipulator, wherein the elevational, Z-axis motion comprises the parallel component and the substantially planar multiple link motion of arm 30 comprises the serial component. A parallel-serial manipulator is uniquely suited for use in the invention because it overcomes disadvantages associated with parallel manipulators and serial manipulators considered singularly. To achieve comparable degrees of freedom, serial manipulators require universal wrists and associated actuators, which are of significant size and weight but which cannot practically be placed close to the base of the robot in order to reduce the effect of their mass. On the other hand, parallel manipulators have very limited motion and working space. Exacerbating these constraints is the context of semiconductor processing, wherein severe limitations are imposed relating to manipulator weight and size and the type of components, such as motors, links, and mechanical linkages, used. These limitations are a function of the highly controlled conditions of friction, contamination, humidity, temperature, etc. GPR robots combine the advantages of parallel and serial manipulators, providing fast global (over a large working area) motion through simple planar (T, R, Y) serial arm and accurate elevational (Z) and tilting motion.

While described with respect to a single end effector 56 and end effector linkage 50, in the preferred embodiment the robot arm is equipped with dual end effectors and associated linkages as shown in FIGS. 5–7. End effectors 92 and 94 are mounted in support structure 96 disposed at the distal portion of extensible linkage 98, and more specifically, in distalmost link 99 thereof. Support structure 96 is rotatable such that Y-axis, or yaw motion, is achieved. A motor 100 and suitable mechanical linkage comprised of belt 102 and pulleys 104 motivate this motion, with motor 100 being mounted in second link 97 of extensible linkage 98. End effector 92 is part of end effector linkage 106, which includes links 108 and 110. End effector 94 is part of end effector linkage 112, which includes links 114 and 116. Motors 118 and 120 motivate linkages 106 and 112, respectively, using appropriate mechanical linkages which include belts 122 and 124 and pulleys 126 and 128. Motion of linkages 112 and 116 is decoupled such that they can be moved independently of each other and of extensible linkage 98. As seen from FIG. 7, end effectors 92 and 94 are designed to be offset vertically so that they can overlap when their respective linkages are extended to the same extent. To that end, upper end effector 92 is provided with a bracket portion 130 which is sized and shaped to clear any substrate, such as semiconductor wafer 132, carried by lower end effector 94. In this manner, end effectors 92 and 94 are capable of occupying the same radial and angular positions with respect to the mounting portion of the extensible linkage 40 in which end effector linkages 106 and 112 are mounted.

The use of two independently motivated end effectors 92 and 94 provides several advantages, including the ability to simultaneously access two oppositely disposed stations 34 from the dual-row arrangement of stations shown in FIG. 1. Additionally, swapping of substrates from a single station 34 can be effected substantially simultaneously, with one end effector for example removing a substrate from a location within a station 34 and the other end effector substituting a second substrate into the same location. This obviates the need to remove the first substrate from the station 34, drop off the first substrate at a different station 34, pick up a second substrate, return to the first station 34, and drop off the second substrate at the first station. The savings in time made possible by the dual end effector arrangement, which translate to substantial savings in processing costs, will be readily appreciated.

The above are exemplary modes of carrying out the invention and are not intended to be limiting. It will be apparent to those of ordinary skill in the art that modifications thereto can be made without departure from the spirit and scope of the invention as set forth in the following claims.

What is claimed is:

1. A robot comprising:
   a frame; and
   a robot arm comprising:
   an extensible linkage mounted to the frame, the extensible linkage including a plurality of links mechanically connected to one another;
   an extensible linkage motor mechanically connected to the links of the extensible linkage such that rotation of the extensible linkage motor translates a mounting portion of one of the links of the extensible linkage along an extensible linkage trajectory;
   one or more end effector linkages movably mounted to the mounting portion of the extensible linkage, each end effector linkage including an end effector and a plurality of links mechanically connected to one another; and
   an end effector motor associated with each end effector linkage and mechanically connected to the plurality of links of the end effector linkage such that rotation of the end effector motor translates the end effector along an end effector trajectory,
   wherein the extensible linkage motor and each end effector motor are independently actuatable such that motion imparted to the extensible linkage by the extensible linkage motor is independent of motion imparted to each end effector linkage by each associated end effector motor.

2. The robot of claim 1, wherein the robot arm is rotatably mounted to the frame at a T-axis of rotation and is motivated to rotate about the T-axis by a third motor mechanically connected to the robot arm and actuatable independently of the first and second motors.

3. The robot of claim 1, wherein a link of the extensible linkage is rotatably mounted in the frame about an R-axis, the first trajectory comprising radial motion with respect to the R-axis.

4. The robot of claim 1, wherein the frame comprises a stationary frame and an elevatable frame having Z-axis motion relative to the stationary frame, the robot arm being mounted in the elevatable frame.

5. The robot of claim 4, wherein the elevatable frame is tiltable with respect to the stationary frame.

6. The robot of claim 1, wherein the end effector linkage is provided with yaw axis motion.

7. The robot of claim 1, wherein the end effector is provided with yaw axis motion.

8. The robot of claim 1, wherein the number of end effector linkages is two.

9. The robot of claim 8, wherein the end effectors of each of the two end effector linkages are mounted so as to be offset, the end effectors thereby being capable of occupying the same radial and angular positions with respect to the mounting portion of the extensible linkage.

10. The robot of claim 1, wherein motion of the extensible linkage occurs over a first duration and motion of at least one end effector linkage occurs over a second duration, and wherein the first and second durations at least partially overlap.

11. The robot of claim 1, wherein the links of the extensible linkage are configured to enable reversible motion of the extensible linkage.

12. The robot of claim 1, wherein the links of each end effector linkage are configured to enable reversible motion of the end effector linkage.

13. A substrate handling system comprising:
   a micro-environment enclosure;
   one or more processing stations in communication with the micro-environment enclosure; and
   a robot enclosed within the micro-environment enclosure, the robot comprising:

a frame; and a robot arm comprising:

an extensible linkage mounted to the frame, the extensible linkage including a plurality of links mechanically connected to one another;

an extensible linkage motor mechanically connected to the links of the extensible linkage such that rotation of the extensible linkage motor translates a mounting portion of one of the links of the extensible linkage along an extensible linkage trajectory;

one or more end effector linkages movably mounted to the mounting portion of the extensible linkage, each end effector linkage including an end effector and a plurality of links mechanically connected to one another; and an end effector motor associated with each end effector linkage and mechanically connected to the plurality of links of the end effector linkage such that rotation of the end effector motor translates the end effector along an end effector trajectory, wherein the extensible linkage motor and each end effector motor are independently actuatable such that motion imparted to the extensible linkage by the extensible linkage motor is independent of motion imparted to each end effector linkage by each associated end effector motor.

14. The robot of claim 13, wherein the robot arm is rotatably mounted to the frame at a T-axis of rotation and is motivated to rotate about the T-axis by a third motor mechanically connected to the robot arm and actuatable independently of the first and second motors.

15. The robot of claim 13, wherein a link of the extensible linkage is rotatably mounted in the frame about an R-axis, the first trajectory comprising radial motion with respect to the R-axis.

16. The robot of claim 14, wherein the frame comprises a stationary frame and an elevatable frame having Z-axis motion relative to the stationary frame, the robot arm being mounted in the elevatable frame.

17. The robot of claim 16, wherein the elevatable frame is tiltable with respect to the stationary frame.

18. The robot of claim 13, wherein the end effector linkage is provided with yaw axis motion.

19. The robot of claim 14, wherein the end effector is provided with yaw axis motion.

20. The robot of claim 13, wherein the number of end effector linkages is two.

21. The robot of claim 20, wherein the end effectors of each of the two end effector linkages are mounted so as to be offset, the end effectors thereby being capable of occupying the same radial and angular positions with respect to the mounting portion of the extensible linkage.

22. The robot of claim 13, wherein motion of the extensible linkage occurs over a first duration and motion of at least one end effector linkage occurs over a second duration, and wherein the first and second durations at least partially overlap.

23. The robot of claim 13, wherein the links of the extensible linkage are configured to enable reversible motion of the extensible linkage.

24. The robot of claim 13, wherein the links of each end effector linkage are configured to enable reversible motion of the end effector linkage.

* * * * *